(12) United States Patent
Li et al.

(10) Patent No.: US 8,630,821 B2
(45) Date of Patent: Jan. 14, 2014

(54) HIGH SPEED DATA TESTING WITHOUT HIGH SPEED BIT CLOCK

(75) Inventors: Miao Li, San Diego, CA (US); Xiaohua Kong, San Diego, CA (US); Nam V. Dang, San Diego, CA (US); Cheng Zhong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 352 days.

(21) Appl. No.: 13/189,926

(22) Filed: Jul. 25, 2011

(65) Prior Publication Data
US 2013/0030767 A1 Jan. 31, 2013

(51) Int. Cl.
*G06F 11/30* (2006.01)

(52) U.S. Cl.
USPC ........ 702/186; 702/117; 714/732; 324/76.53; 375/221; 375/224; 375/345; 327/146; 327/423

(58) Field of Classification Search
USPC .......... 702/117, 186; 714/724, 704, 738, 732, 714/736; 324/762.02, 764.01, 606, 76.53; 375/221, 224, 345; 377/69, 72; 327/146, 423
See application file for complete search history.

(56) References Cited

U.S. PATENT DOCUMENTS

| | | | | |
|---|---|---|---|---|
| 5,727,027 | A * | 3/1998 | Tsuda | 375/329 |
| 6,201,829 | B1 * | 3/2001 | Schneider | 375/221 |
| 6,275,508 | B1 * | 8/2001 | Aggarwal et al. | 370/503 |
| 6,865,222 | B1 * | 3/2005 | Payne | 375/224 |
| 7,098,685 | B1 * | 8/2006 | Agrawal et al. | 326/38 |
| 7,099,278 | B2 * | 8/2006 | Momtaz | 370/249 |
| 7,443,941 | B2 * | 10/2008 | Farjad-rad | 375/373 |
| 7,450,039 | B2 * | 11/2008 | Yoshizaki | 341/101 |
| 7,617,064 | B2 * | 11/2009 | Stakely et al. | 702/117 |
| 7,672,406 | B2 * | 3/2010 | Takeuchi | 375/345 |
| 7,681,097 | B2 * | 3/2010 | Park | 714/732 |
| 7,756,197 | B1 * | 7/2010 | Ferguson et al. | 375/224 |
| 7,813,297 | B2 * | 10/2010 | Hafed | 370/252 |
| 7,848,367 | B2 * | 12/2010 | Hornbuckle et al. | 370/537 |
| 7,920,014 | B2 * | 4/2011 | Nagashima et al. | 327/423 |
| 7,924,185 | B2 * | 4/2011 | Fukuhisa | 341/100 |
| 8,108,567 | B2 * | 1/2012 | Bohm | 710/14 |
| 8,149,973 | B2 * | 4/2012 | Fukuda et al. | 375/354 |
| 8,237,836 | B2 * | 8/2012 | Shimano | 348/308 |
| 8,379,002 | B2 * | 2/2013 | Kang et al. | 345/204 |
| 2003/0031133 | A1 * | 2/2003 | Momtaz | 370/241 |
| 2004/0221056 | A1 | 11/2004 | Kobayashi | |
| 2004/0223559 | A1 * | 11/2004 | Hill | 375/306 |
| 2005/0156586 | A1 * | 7/2005 | Kanbayashi | 324/76.53 |
| 2005/0258856 | A1 * | 11/2005 | Kishimoto et al. | 324/765 |

(Continued)

OTHER PUBLICATIONS

International Search Report and Written Opinion—PCT/US2012/048207—ISA/EPO—Oct. 18, 2012.

*Primary Examiner* — Carol S Tsai
(74) *Attorney, Agent, or Firm* — Sam Talpalatsky; Nicholas J. Pauley; Joseph Augusta

(57) ABSTRACT

System and method for testing a high speed data path without generating a high speed bit clock, includes selecting a first high speed data path from a plurality of data paths for testing. Coherent clock data patterns are driven on one or more of remaining data paths of the plurality of data paths, wherein the coherent clock data patterns are in coherence with a low speed base clock. The first high speed data path is sampled by the coherent clock data patterns to generate a sampled first high speed data path, which is then tested at a speed of the low speed base clock.

28 Claims, 7 Drawing Sheets

(56) References Cited

U.S. PATENT DOCUMENTS

| | | | |
|---|---|---|---|
| 2008/0013456 A1* | 1/2008 | Hafed | 370/241 |
| 2008/0109690 A1* | 5/2008 | Park | 714/732 |
| 2008/0122666 A1* | 5/2008 | Yoshizaki | 341/101 |
| 2008/0143396 A1* | 6/2008 | Nishida | 327/146 |
| 2008/0192814 A1* | 8/2008 | Hafed et al. | 375/224 |
| 2009/0147708 A1* | 6/2009 | Liu et al. | 370/284 |
| 2009/0207957 A1* | 8/2009 | Fukuda et al. | 375/354 |
| 2010/0013579 A1 | 1/2010 | Horan et al. | |
| 2010/0020179 A1 | 1/2010 | Horan et al. | |
| 2011/0157104 A1* | 6/2011 | Kang et al. | 345/204 |
| 2013/0187799 A1* | 7/2013 | Chang | 341/101 |

* cited by examiner

PROGRAMMABLE DELAY LOGIC

HIGH SPEED DATA TESTING WITHOUT HIGH SPEED BIT CLOCK

FIELD OF DISCLOSURE

Disclosed embodiments are directed to designs for testing high speed data sequences. More particularly, embodiments are directed to designs for testing multiple high speed data channels by emulating high speed bit clocks from data patterns, without generating high speed bit clocks.

BACKGROUND

Designs for testing and testability play an important role in the design and manufacture of integrated, circuits. State of the art multimedia applications involve very high speed data transmission and reception. Data channels in transmitter (TX) and receiver (RX) devices may need to be tested at operational speed in order to expose faults and errors in the physical layer (PHY) implementation of TX and RX circuits. At-speed testing of data channels usually requires clocks of speeds corresponding to bit speeds of the data channels. However, it is often impractical and power intensive to generate such high speed clocks in test mode.

For example, a High-Definition Multimedia Interface (HDMI) is popularly used in connecting digital video sources, such as, DVD players and personal computers, to digital display devices, such as, televisions and computer monitors. An HDMI component may accept multiple channels of data, such as, Red Green Blue (RGB) components of source video in compressed parallel format and transmit the data as uncompressed serial digital data streams to the digital display devices.

With reference to FIG. 1, there is shown a conventional HDMI TX PHY 100. Input ports 103a-c of serializer 110 accept RGB data channels 102a-c respectively, as shown. Each of the RGB data channels 102a-c are 10-bit wide buses, and clocked at a standard frequency of 148.5 MHz, using pixel clock 106, derived from Phase Locked Loop (PLL) 112. The data is serialized by serializer 110 and driven on output ports 105a-c as single bit RGB data buses 104a—c. Due to the serialization, each of the data buses, 104a-c, carry 10 bits of data in a single cycle of the pixel clock 106. In other words, the data buses 101a-c are driven at 10 times the bit rate of the pixel clock, 10×148.5 MHz, or 1.485 GHz.

Accordingly, in order to properly test the serialized data transmitted on data buses 104a-c, a 1.485 GHz bit clock needs to be generated. Generating and operating clocks at such high speeds incurs very high power consumption. Moreover, it is often unfeasible to generate such high frequency clocks using traditional clock generation methods, in test mode. As the speed and frequency demands on data transmission keep increasing, the problem is exacerbated. Accordingly, there is a need in the art for efficiently testing high speed data channels, such as, data buses 103a-c, while avoiding the aforementioned problems associated with high speed bit clocks.

SUMMARY

Exemplary embodiments are directed to systems and method for testing a high speed data path, without generating a high speed bit clock.

For example, an exemplary embodiment is directed to a method of testing a high speed data path comprising, selecting a first high speed data path from a plurality of data paths for testing and driving coherent clock data patterns on one or more of remaining data paths of the plurality of data paths, wherein the coherent clock data patterns are in coherence with a low speed base clock. The first high speed data path is then sampled by the coherent clock data patterns to generate a sampled first high speed data path, and the sampled first high speed data path is tested at a speed of the low speed base clock.

Another exemplary embodiment is directed to an apparatus for testing a high speed data path comprising a plurality of data paths, a low speed base clock, and selection logic configured to select a first high speed data path from the plurality of data paths. A pattern generator is configured to drive coherent clock data patterns on one or more of remaining data paths of the plurality of data paths, wherein the coherent clock data patterns are in coherence with the low speed base clock. A deserializer is configured to sample the first high speed data path by using the coherent clock data patterns in order to generate a sampled first high speed data path, and a checker is configured to test the sampled first high speed data path at a speed of the low speed base clock.

Yet another exemplary embodiment is directed to a system for testing a high speed data path comprising means for selecting a first high speed data path from a plurality of data paths for testing, means for driving coherent clock data patterns on one or more of remaining data paths of the plurality of data paths, wherein the coherent clock data patterns are in coherence with a low speed base clock, means for sampling the first high speed data path by the coherent clock data patterns to generate a sampled first high speed data path, and means for testing the sampled first high speed data path at a speed of the low speed base clock.

A further exemplary embodiment is directed to non-transitory computer-readable storage medium comprising code, which, when executed by a processor, causes the processor to perform operations for testing a high speed data path, the non-transitory computer-readable storage medium comprising: code for selecting a first high speed data path from a plurality of data paths for testing, code for driving coherent clock data patterns on one or more of remaining data paths of the plurality of data paths, wherein the coherent clock data patterns are in coherence with a low speed base clock, code for sampling the first high speed data path by the coherent clock data patterns to generate a sampled first high speed data path, and code for testing the sampled first high speed data path at a speed of the low speed base clock.

Yet another exemplary embodiment is directed to a method of testing a high speed data path comprising: step for selecting a first high speed data path from a plurality of data paths for testing, step for driving coherent clock data patterns on one or more of remaining data paths of the plurality of data paths, wherein the coherent clock data patterns are in coherence with a low speed base clock, step for sampling the first high speed data path by the coherent clock data patterns to generate a sampled first high speed data path, and step for testing the sampled first high speed data path at a speed of the low speed base clock.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
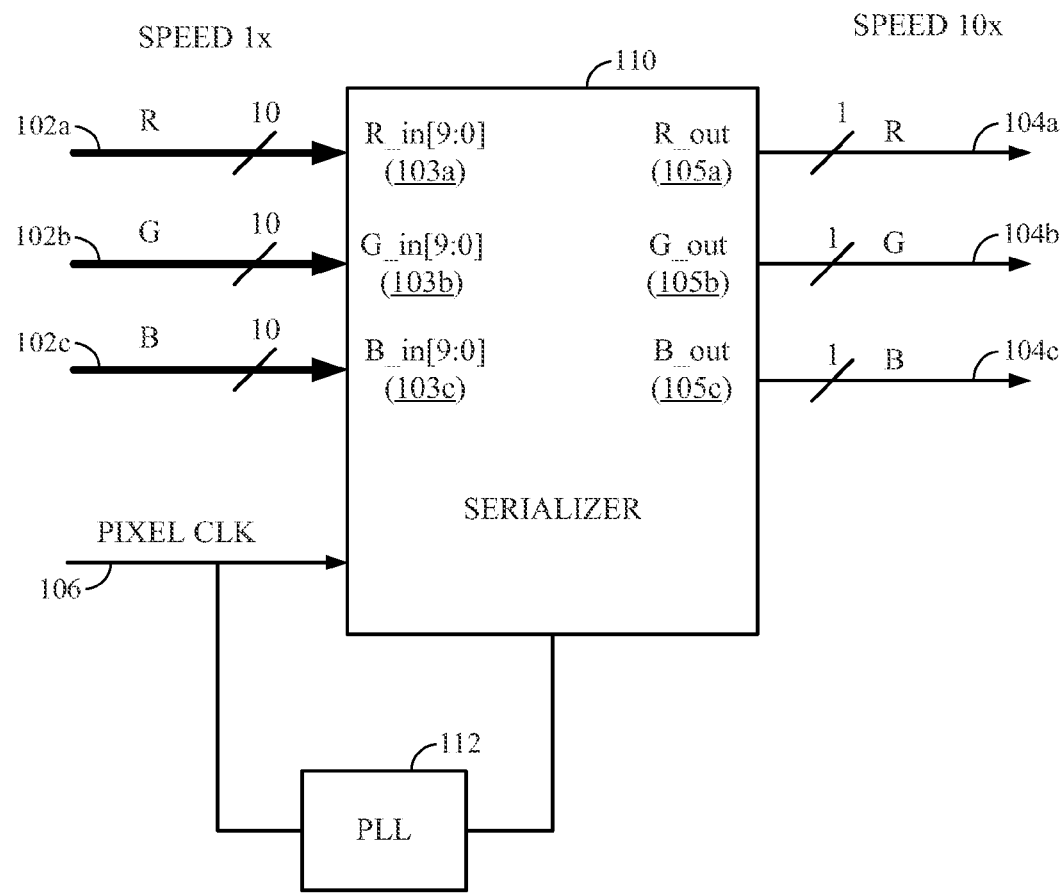
FIG. 1 is an illustration of a conventional HDMI TX.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising.", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described, herein, the corresponding form of any such embodiments may be described herein as, for example, "logic configured to" perform the described action.

Disclosed embodiments include systems and method for testing high speed data paths without generating high speed bit clocks. Predetermined data patterns are used in data channels to emulate high speed coherent clocks. As used herein, the term "coherent" generally refers to being synchronized in phase. A plurality of data channels may be tested by selecting a first data channel for at-speed testing, and utilizing the remaining data channels for coherent clock data patterns. The selection of the data channel under test may be rotated, such that all data channels may be similarly tested.

Embodiments will now be described with reference to exemplary systems and method for testing HDMI TX PHY. However, it will be understood that the disclosed techniques are not to be construed as so limited to HDMI, but are equally applicable to testing any data channel or data path.

Figure 2:
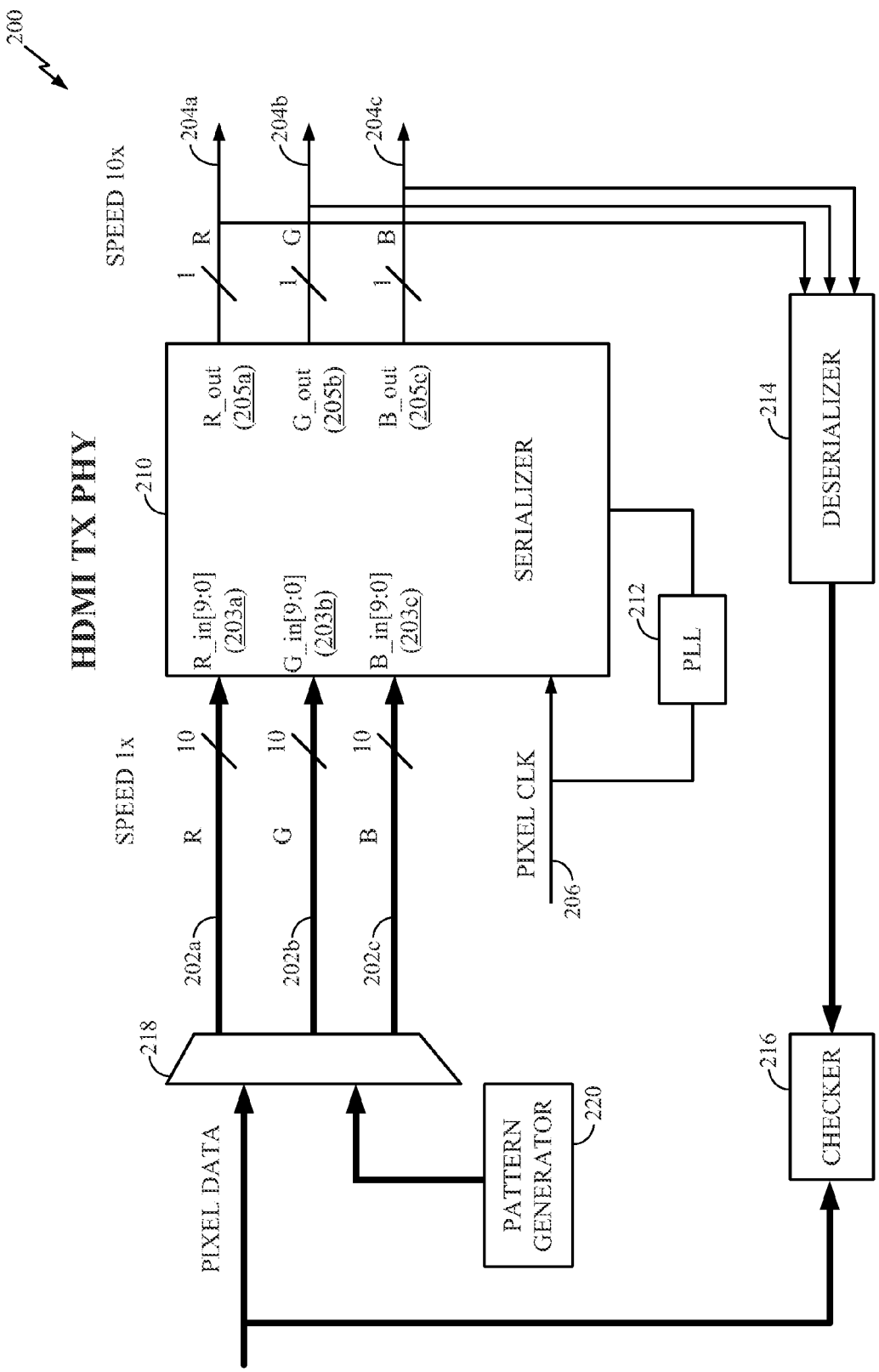
FIG. 2 illustrates an exemplary embodiment thr testing high speed data output front a HDMI TX PHY.

Referring to FIG. 2, an exemplary system for testing high speed data output from HDMI TX PHY 200 is illustrated. Similar to the conventional serializer 110 shown in FIG. 1, serializer 210 accepts 10-bit wide RGB data at input ports 203a-c from data channels 202a-c respectively. Serializer 210 outputs serialized single bit RGB data on data buses 204a-c, from output ports 205a-c respectively. As with HDMI TX PHY 100 of FIG. 1, the data speed of data buses 204a-c is 10 times the data speed, of data channels 202a-c. Pixel clock 206, derived from Phase Locked Loop (PLL) 212, is used to clock serializer 210. For illustrative purposes, pixel clock 206 is assumed to be of 148.5 MHz frequency. Accordingly, the bit speed of data buses 204a-c is 1.485 GHz in one exemplary embodiment.

As described previously, it is desirable to avoid generating a 1.485 GHz clock for testing the output data on data buses 204a-c. Accordingly, pattern generator 220 is employed to assist in testing the high speed output data buses 204a-c, without requiring a corresponding high speed bit clock. Pattern generator 220 is clocked by pixel clock 206, and generates data patterns that are coherent with pixel clock 206, and emulate the behavior of pixel clock 206 with altered frequencies. For example, a data pattern denoted "clk1x" comprises driving a value 1 on all 10 bits of a 10-bit data channel in one cycle of pixel clock 206, followed by 0 on all the 10-bits in the next cycle. This pattern is repeated with alternate cycles of 1s and 0s. It will be recognized that when a 10-bit data channel with a clk1x data pattern is serialized by serializer 210, the serialized output data bus will comprise 10 cycles of the constant value 1, followed by 10 cycles of the constant value 0, followed by 10 cycles of the constant value 1, and so on. Because the output data bus is at a bit speed of 10× the speed of pixel clock 206, the output data bus essentially resembles a clock toggling between 1 and 0 every cycle at the frequency of pixel clock 206. Therefore, this data pattern is denoted clk1x, as it is coherent with, and at the same speed of pixel clock 206.

Similarly, a data pattern denoted "clk5x" comprises a pattern with alternate 1s and 0s, such as "1010101010", on the 10-bit wide data channels per clock cycle. As will be recognized, when such a pattern is serialized, the serialized output data emulates a clock toggling between 1 and 0 at a speed that is 5× the speed of clk1x. Finally, it will also be appreciated that the data output on data buses 204a-c from serializer 210 is clocked by a clock denoted by"clk10x", as the data speed on data buses 204a-c is 10× the speed of clk1x.

Returning now to FIG. 2, a first data channel of the RGB data channels 202a-c is selected for testing, and thereafter, the data channels are rotated for testing purposes, as will be further explained below. Mux 218 is configured to allow the data channel under test to carry normal operating data, while transposing data patterns such as clk1x and clk5x from pattern generator 220 on the other two data channels.

As illustrated in FIG. 2, the R data channel, 202a is first selected for testing. As is also illustrated, a data pattern corresponding to clk5x is driven on to the G data channel, 2021), and clk1x on B data channel, 202c. Serializer 210 serializes the data in each of these data channels 202a-c, and outputs the serialized data on RGB data buses 204a-c. It will be recalled that RGB data buses 204a-c are driven at a bit speed of 1.485 GHz, and a corresponding bit clock of 1.485 GHz is not available. In order to test the accuracy of serialized data in the R data bus 204a under test, all three data buses 204a-c are fed into a specialized desialzer block, deserializer 214.

Essentially, deserializer 214 operates to receive the 1.485 GHz data from data buses 204a-c and convert them into parallel data at a bit speed of 148.5 MHz. Comparison logic in checker 216 is thereafter used to check the original input data on R channel 202a against the deserialized data output from deserializer 214 for R data bus 204a for faults.

Figure 3:
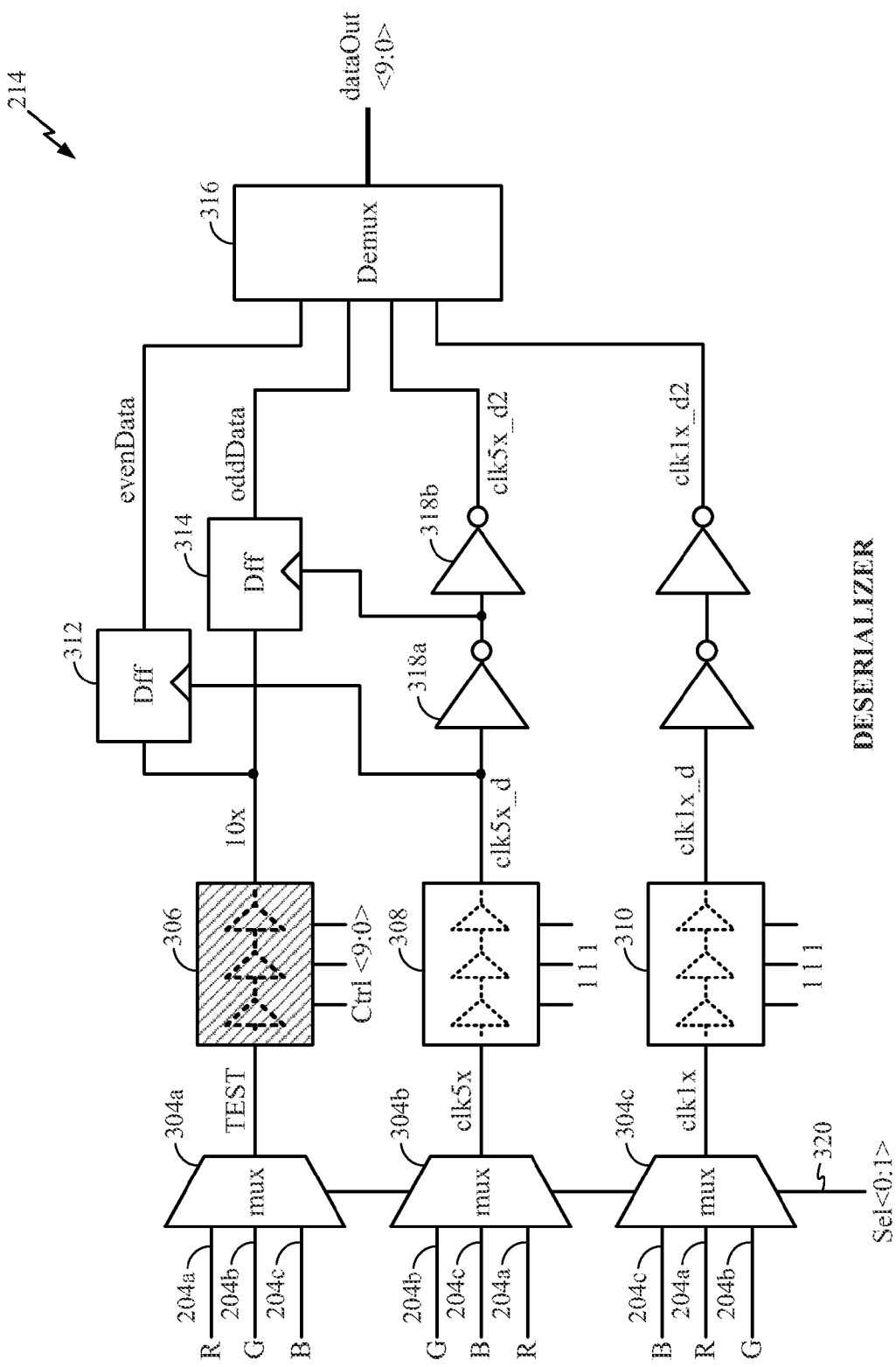
FIG. 3 illustrates an expanded view of the deserializer illustrated in the exemplary embodiment of FIG. 2.

With reference now to FIG. 3, a detailed description of deserializer 214 will now be provided. Muxes 304a-c receive the RGB data buses 204a-c as shown. Select lines 320 are configured to select the data bus under test, in this case, R data bus 204a as the output of mix 304a. Mux 304b selects the G data bus 204b carrying the clk5x data pattern, and mux 304c selects B data bus 204c carrying the clk1x data pattern.

The output of mux 304a is passed on to programmable delay logic 306. Essentially, programmable delay logic 306 allows programmable delay control of the data bus under test to allow fine tuned alignment to the coherent clock data patterns clk1x and clk5x. The outputs of mux 304b and 304c are passed through delay elements 308 and 310 respectively. Exemplary embodiments can include programmable delay control for delay elements 308 and 310 as well. However, adjusting the delay of the data bus under test in programmable delay logic block 306 is usually sufficient, and simpler fixed delay logic can be employed for delay elements 308 and 310.

Figure 4:
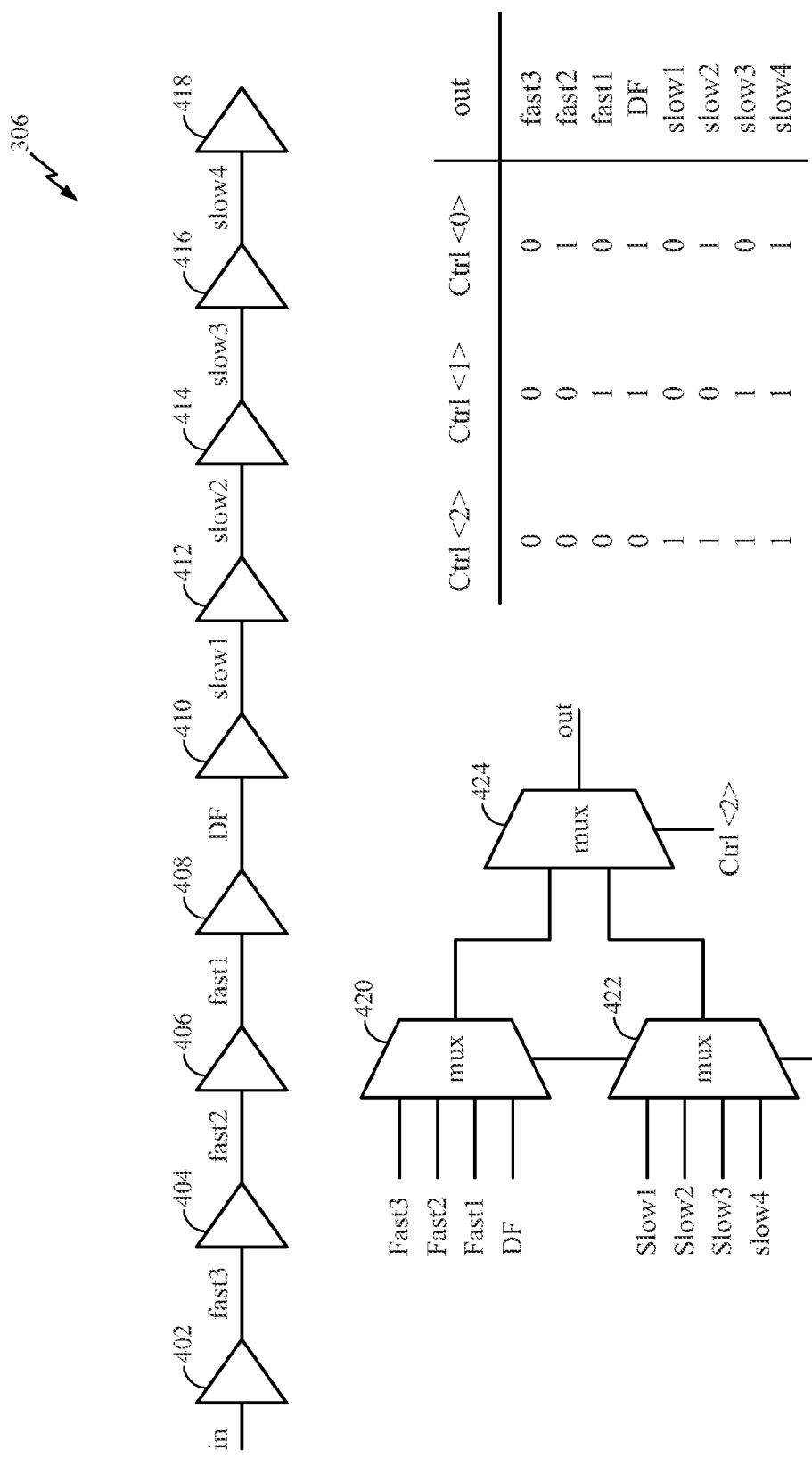
FIG. 4 illustrates an expanded view of the programmable delay logic illustrated in deserializer of FIG. 3.

With reference to FIG. 4, an exemplary implementation of programmable delay logic 306 is shown. A set of buffer elements 402-418 are connected in series as shown. Input data, such as the output of mux 304a is fed into the first buffer element 402, through the port, "in". The input data incurs delays ranging from very fast (fast3) to very slow (slow4) based on the number of buffer elements traversed. A default delay (DF) is assigned to the output of buffer element 408. Muxing structures 420, 422, and 424 are then used to select the input data, delayed by the desired amount, by choosing the output of one of the buffer elements 402-418. Thus, programmable delay logic 306 is advantageously employed for fine tuned control in aligning the data bus under test to the coherent clock data patterns.

Returning now to FIG. 3, the output of programmable delay logic 306, D10x_d is then sampled by clk5x_d (delayed version of elk5x), into even and odd data using D flip-flops Dff 312 and Dff 314. MT 312 and Dff 314 are clocked by clk5x_d, which is at half the speed of D10x_d. Referring to the output of Dff 312 available after every sampling by clk5x_d as "evenData.", it will be seen that the inverted version of clk5x_d, output from inverter 318a, provides "oddData". For example, for 10 bits of serialized data denoted as [r0, r1, r2, r3, r4, r5, r6, r7, r8, r9], evenData would comprise the set [r0, r2, r4, r6, r8] and oddData would comprise the set [r1, r3, r5, r7, r9]. The coherent clock clk5x_d is delayed by inverters 318a and 318b to form the delayed version of the coherent clock, clk5x_d2. Similarly, coherent clock clk1x_d is delayed by two inverters to form clk1x_d2. The subsets evenData and oddData obtained in this manner, are fed into demux 316, along with delayed versions of the coherent clocks, clk1x_d2 and clk5x_d2.

Figure 5:
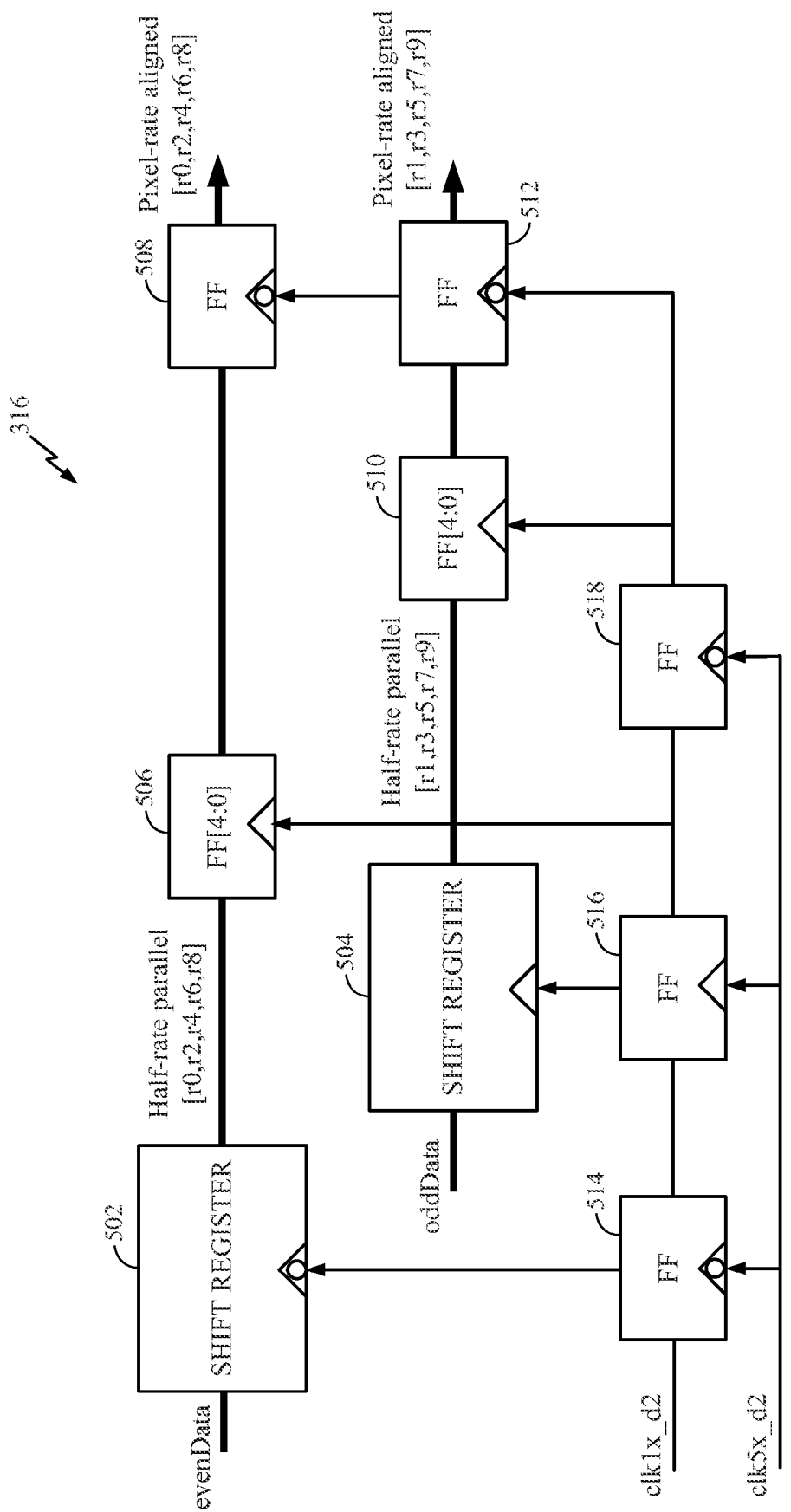
FIG. 5 illustrates an expanded view of the demux illustrated in deserializer of FIG. 3.

Detailed operation of demux 316 will now be provided with reference to FIG. 5. As illustrated in FIG. 5, shift registers 502 and 504 accept evenData and oddData respectively. Shift register 502 is negative-edge triggered, whereas shift register 504 is positive-edge triggered. Flip-flops FF 514, FF 516, and FF 518 are clocked by clk5x_d2. FF 514 and FF 518 are negative-edge triggered, whereas FF 516 is positive-edge triggered. The coherent clock clk1x_d2 is sampled by FF 514 on falling edges of clk5x_d2, and this sampled version of clk1x_d2 clocks shift register 502. It will be recognized that the above logical arrangement essentially allows for the shift register to shift out one bit of evenData per clock cycle of the coherent clock clk5x_d2. The 5 bits of evenData shifted oat in 5 consecutive cycles of clk5x_d2 are stored in the 5-bit wide register, FF 506, such that over the time period of one cycle of clk1x_d2 (or 5 cycles of clk5x_d2), all 5 bits of evenData are stored in FF 506.

Similarly, the combination of shift register 504, FF 516, FF 518 and FF 510 operate to store 5 bits of oddData in FF 510 over the time period of one cycle of clk1x_d2. The oddData and evenData are then sampled by FF 508 and FF 512, clocked by clk1x_d2 as sampled by clk5x_d2, as shown in FIG. 5. The outputs of FF 508 and FF 512 are now aligned with pixel clock 206, and merged together to form the 10-bit parallel output of deserializer 214 (referring back to FIG. 2). Thereafter, the data in R data bus 204a is compared with the input data from R channel data 202a which is stored in checker 216. The comparison reveals functional correctness and faults if any in the HDMI TX PHY 200.

Thus, the data in 148.5 MHz R data channel 202a can be serialized by serializer 210 to provide 1.485 GHz R data bus 204a in HDMI TX PHY 200; and the HDMI TX PHY 200 can be tested without requiring the generation of a 1.485 GHz clock, by using coherent clock data patterns clk1x and clk5x on the 0 and B data channels 202b-c. Once the data path for serializing R data is satisfactorily tested, the above described testing can be rotated. For example, the data path for serializing G data can be chosen as the data path under test, and the R data channel 202a and B data channel 202c can be utilized to carry coherent clock data patterns clk1x and clk5x. Similarly, the data path for serializing B data can be tested with R and G data channels 202a-b carrying clk1x and clk5x. Muxes 304a-c, as shown in FIG. 3, may be used for the above process of rotating through the three RGB data paths for testing purposes.

Skilled persons will recognize that the above techniques can be extended to testing any high speed data path, while avoiding the generation of corresponding high speed clocks. Coherent clock data patterns need not be limited to clk1x and clk5x, but appropriate coherent clocks may be designed based on circuit needs.

Figure 6:
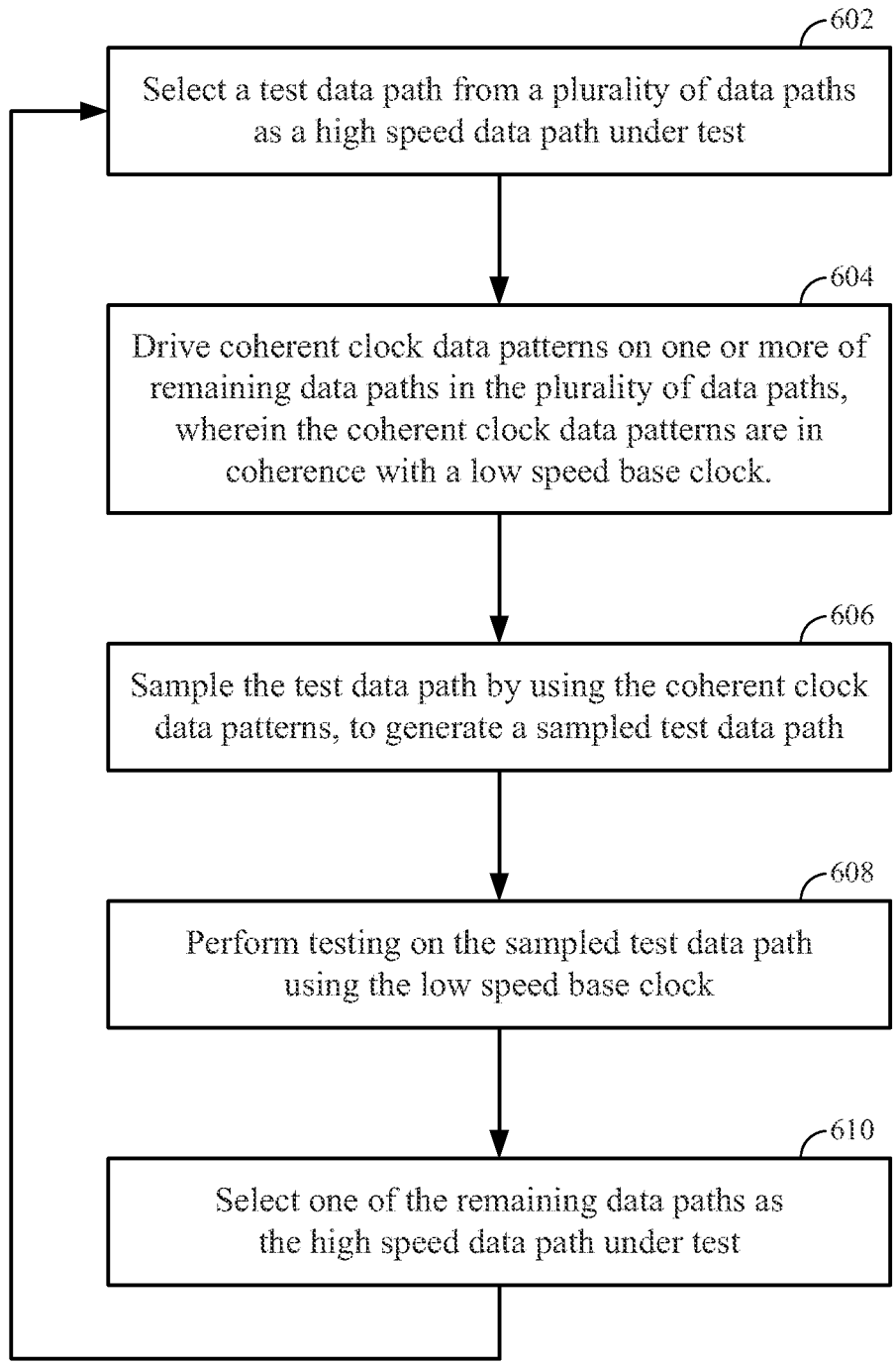
FIG. 6 is a flow chart detailing an exemplary method for testing a high speed data path.

It will also be appreciated that embodiments include various methods for performing the processes disclosed herein. For example, as illustrated in FIG. 6, an embodiment can include a method of testing a high speed data path comprising selecting a test data path from a plurality of data paths as a high data path under test (Block 602). Coherent clock data patterns are driven on one or more of remaining data paths in the plurality of data paths, wherein the coherent clock data patterns are in coherence with a low speed base clock (Block 604). The test data path is sampled by the coherent clock data patterns to generate a sampled test data path (Block 606), such that the sampled test data path can be tested using the low speed base clock (Block 608). Once the test data path is tested, one of the remaining data paths is selected as the high speed data path under test (Block 610), and the process returns to Block 602.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for testing high speed data paths without requiring generation of corresponding high speed bit clocks. Accordingly, the invention is not limited to illustrated examples and any means for performing the functionality described herein are included in embodiments of the invention.

Figure 7:
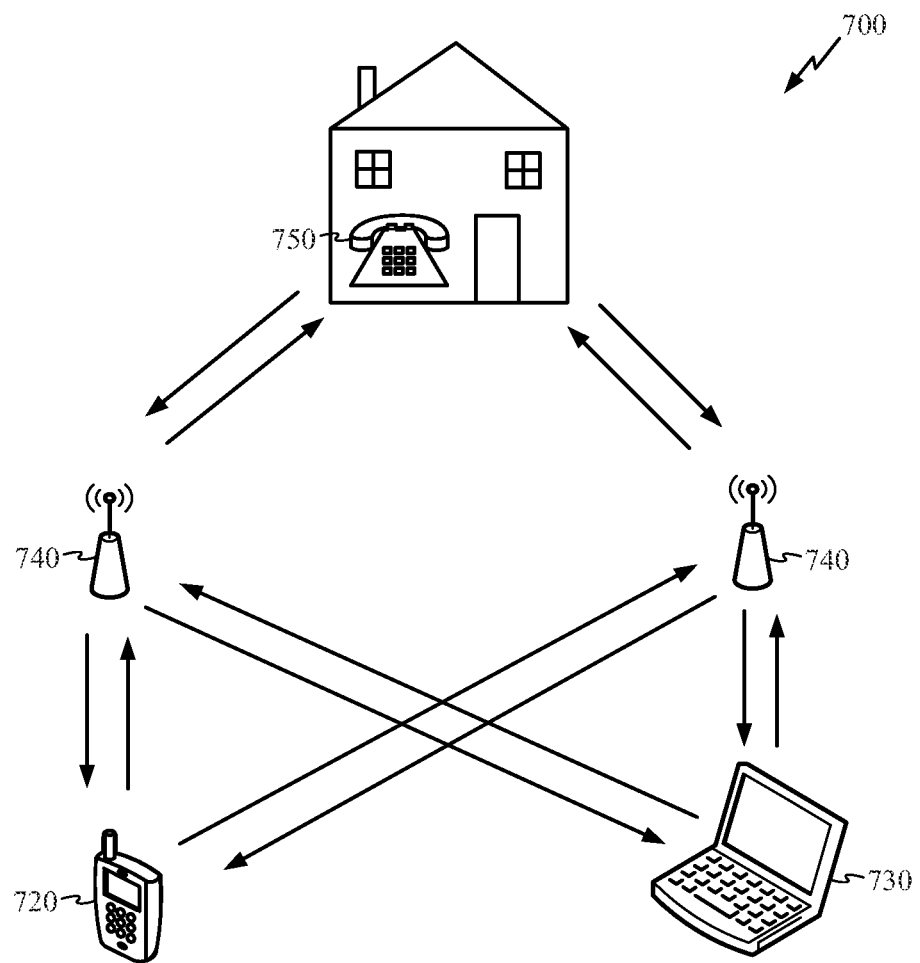
FIG. 7 illustrates an exemplary wireless communication system 700 in which an embodiment of the disclosure may be advantageously employed.

FIG. 7 illustrates an exemplary wireless communication system 700 in which an embodiment of the disclosure may be advantageously employed. For purposes of illustration, FIG. 7 shows three remote units 720, 730, and 750 and two base stations 740. In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, settop boxes, music players, video players, entertainment units, fixed location data units such as meter reading equipment, or any other device that stores or retrieves data or computer instructions, or any combination thereof. Although FIG. 7 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of testing a high speed data path comprising:
   selecting a first high speed data path from a plurality of data paths for testing;
   driving coherent clock data patterns on one or more of remaining data paths of the plurality of data paths, wherein the coherent clock data patterns are in coherence with a low speed base clock;
   sampling the first high speed data path by the coherent clock data patterns to generate a sampled first high speed data path; and
   testing the sampled first high speed data path at a speed of the low speed base clock.

2. The method of claim 1, further comprising de-selecting the first high speed data path and selecting a second high speed data path from the plurality of data paths for testing.

3. The method of claim 2, further comprising driving coherent clock data patterns on the first high speed data path.

4. The method of claim 1, wherein speeds of the coherent clock data patterns are multiples of the speed of the low speed base clock.

5. The method of claim 4, wherein a speed of a first coherent clock data pattern is five times the speed of the low speed base clock.

6. The method of claim 4, wherein a speed of a second coherent clock data pattern is ten times the speed of the low speed base clock.

7. The method of claim 1, wherein the plurality of data paths comprise low speed parallel data converted to high speed serial data by a serializer.

8. The method of claim 7, wherein the serializer is integrated in a high definition multimedia interface (HDMI) transmitter.

9. A system for testing a high speed data path comprising:
   means for selecting a first high speed data path from a plurality of data paths for testing;
   means for driving coherent clock data patterns on one or more of remaining data paths of the plurality of data paths, wherein the coherent clock data patterns are in coherence with a low speed base clock;
   means for sampling the first high speed data path by the coherent clock data patterns to generate a sampled first high speed data path; and
   means for testing the sampled first high speed data path at a speed of the low speed base clock.

10. The system of claim 9, further comprising means for de-selecting the first high speed data path and means for selecting a second high speed data path from the plurality of data paths for testing.

11. The system of claim 10, further comprising means for driving coherent clock data patterns on the first high speed data path.

12. The system of claim 9, wherein speeds of the coherent clock data patterns are multiples of the speed of the low speed base clock.

13. The system of claim 9, wherein the plurality of data paths comprise low speed parallel data converted to high speed serial data by a serializer.

14. The system of claim 13, wherein the serializer is embodied in a high definition multimedia interface (HDMI) transmitter.

15. The system of claim 9, integrated in at least one semiconductor die.

16. The system of claim 9, further comprising a device, selected from the group consisting of a set top box, music player, video player, entertainment unit, navigation device, communications device, personal digital assistant (PDA), fixed location data unit, and a computer, into which the means for selecting, means for driving, means for sampling, and means for testing are incorporated.

17. A non-transitory computer-readable storage medium comprising code, which, when executed by a processor, causes the processor to perform operations for testing a high speed data path, the non-transitory computer-readable storage medium comprising:
   code for selecting a first high speed data path from a plurality of data paths for testing;
   code for driving coherent clock data patterns on one or more of remaining data paths of the plurality of data paths, wherein the coherent clock data patterns are in coherence with a low speed base clock;
   code for sampling the first high speed data path by the coherent clock data patterns to generate a sampled first high speed data path; and
   code for testing the sampled first high speed data path at a speed of the low speed base clock.

18. The non-transitory computer-readable storage medium of claim 17, further comprising code for de-selecting the first high speed data path and code for selecting a second high speed data path from the plurality of data paths for testing.

19. The non-transitory computer-readable storage medium of claim 18, further comprising code for driving coherent clock data patterns on the first high speed data path.

20. The non-transitory computer-readable storage medium of claim 17, wherein speeds of the coherent clock data patterns are multiples of the speed of the low speed base clock.

21. The non-transitory computer-readable storage medium of claim 17, integrated in at least one semiconductor die.

22. The non-transitory computer-readable storage medium of claim 17, further comprising a device, selected from the group consisting of a set top box, music player, video player, entertainment unit, navigation device, communications device, personal digital assistant (PDA), fixed location data unit, and a computer, into which the processor is integrated.

23. A method of testing a high speed data path comprising:
   step for selecting a first high speed data path from a plurality of data paths for testing;
   step for driving coherent clock data patterns on one or more of remaining data paths of the plurality of data paths wherein the coherent clock data patterns are in coherence with a low speed base clock;
   step for sampling the first high speed data path by the coherent clock data patterns to generate a sampled first high speed data path; and
   step for testing the sampled first high speed data path at a speed of the low speed base clock.

24. The method of claim 23, further comprising step for de-selecting the first high speed data path and step for selecting a second high speed data path from the plurality of data paths for testing.

25. The method of claim 24, further comprising step for driving coherent clock data patterns on the first high speed data path.

26. The method of claim 23, wherein speeds of the coherent clock data patterns are multiples of the speed of the low speed base clock.

27. The method of claim 23, wherein the plurality of data paths comprise low speed parallel data converted to high speed serial data by a serializer.

28. The method of claim 27, wherein the serializer is integrated in a high definition multimedia interface (HDMI) transmitter.

* * * * *